United States Patent [19]

Agusta et al.

[11] 3,865,652

[45] Feb. 11, 1975

[54] METHOD OF FORMING SELF-ALIGNED FIELD EFFECT TRANSISTOR AND CHARGE-COUPLED DEVICE

[75] Inventors: Benjamin Agusta, Burlington; Joseph J. Chang, Shelburne; Madhukar L. Joshi, Essex Junction, all of Vt.

[73] Assignee: International Business Machines Corp., Armonk, N.Y.

[22] Filed: Oct. 5, 1973

[21] Appl. No.: 403,745

Related U.S. Application Data

[62] Division of Ser. No. 257,504, May 30, 1972, abandoned.

[52] U.S. Cl. .................... 148/187, 357/41, 357/48

[51] Int. Cl. .................... H01l 7/44

[58] Field of Search .......... 148/187; 317/234, 235

[56] References Cited

UNITED STATES PATENTS

| | | | |
|---|---|---|---|
| 3,519,504 | 7/1970 | Cuomo | 148/187 |
| 3,615,940 | 10/1971 | Kang | 148/187 |
| 3,698,966 | 10/1972 | Harris | 148/187 |

OTHER PUBLICATIONS

Dhaka et al., "Masking Technique," IBM Tech. Discl. Bull., Vol. 11, No. 7, Dec. '68, pp. 864, 865.

Vadasz et al., "Silicon Gate Technology," IEEE Spectrum, Oct. '69, pp. 28–35.

*Primary Examiner*—L. Dewayne Rutledge
*Assistant Examiner*—J. M. Davis
*Attorney, Agent, or Firm*—Francis J. Thornton

[57] ABSTRACT

A semiconductor device containing in a single semiconductor body a self-aligned Field Effect Transistor and a Charge-Coupled Array having an improved capacity for storing charges. The device is formed by depositing both polysilicon and silicon nitride layers over a silicon dioxide layer on the surface of a silicon body and selectively etching these layers so that suitable dopants may be diffused or ion-implanted into selected areas of the underlying silicon body to form, in the same semiconductor body, an improved charge-coupled array having an improved self-aligned Field Effect Transistor associated therewith. This process not only results in a device in which the chance of an inversion layer under the oxide on the surface of the device is substantially reduced, but also provides a self-aligned Field Effect Transistor having a thinner gate oxide and a charge-coupled array that has an increased capacity for storing charges. The improved array so formed also has, during operation, zero spaced depletion regions so that unwanted electrical discontinuities between or within the depletion regions of the charge-coupled array are avoided. Because zero spacing is achieved by using these thin conducting layers, the metal phase lines can be made narrow thus leaving openings in the charge transfer channel making the device particularly suitable for imaging applications.

8 Claims, 6 Drawing Figures

METHOD OF FORMING SELF-ALIGNED FIELD EFFECT TRANSISTOR AND CHARGE-COUPLED DEVICE

This is a division, of application Ser. No. 257,504 filed May 30, 1972, now abandoned.

RELATED APPLICATIONS

Application Ser. No. 95,225 filed on Dec. 4, 1970 by J. J. Chang and J. W. Sumilas and assigned to the same assignee as the present invention, now U.S. Pat. No. 3,819,959, teaches that junctionless charge-coupled semiconductor devices can be operated with but two-voltage signals when the semiconductor body has an electrode array arranged on a contoured, insulating layer on a surface of the body.

Application Ser. No. 129,096 filed Mar. 29, 1971 by B. Agusta et al. and assigned to the same assignee as the present invention, now abandoned, teaches that the advantages of a zero gap two-phase charge-coupled semiconductor body and a specific method of making such a device.

BACKGROUND OF THE INVENTION

1. Field of the Invention

This invention relates generally to monolithic semiconductor structures including the fabrication thereof and more particularly to a monolithic device in which charges are created, maintained and transported through the semiconductor body without the necessity of P-N junctions in the body.

2. Description of the Prior Art

Recently there has been discussed in the literature semiconductor devices without fixed P-N junctions therein which utilize the property of the semiconductor material itself, together with appropriate electrodes on the surface of the device to transport charages through the body of the device.

Basically, these novel junctionless devices as described in the literature operate as follows:

The application of three out of phase voltages of the same intensity to a monolithic uniform body of single type semiconductor material creates, within the body of the material, three different, well defined, depletion regions having three different field intensities therein corresponding to the three different applied voltages and when charges are introduced into such depletion regions, the charges are caused to be transported through the body in a controlled manner under the influence of the three created fields within the body. By appropriate manipulation of the three different imposed voltages, the charges can be recirculated, stored, or delayed in their movement through the body.

U.S. Pat. Nos. 3,374,406 and 3,374,407 teach various means of creating stepped and sloped inversion regions within FET type devices by creating stepped oxide ramps or alternating insulating layers of uniform thickness with different dielectric constants or by providing a channel with different conductivities in conjunction with the oxide structure. In these patents such contoured inversion regions are used to control the flow of current between the source and drain of an FET device by controlling the pinch off levels of such devices.

U.S. Pat. No. 3,430,112 teaches an insulated Field Effect Transistor having a surface channel consisting of a plurality of areas having different surface resistivities extending across the body can provide a remote cutoff characteristic for the device thereby permitting operation of the device as a vacuum triode analog.

U.S. Pat. No. 3,475,234 discloses a method of making field effect devices by using multiple dielectric layers and a self limiting etch technique based on the use of a differential etchant so that proper location of the gate electrode with respect to the source and drain junctions of the FET so produced is insured. This is accomplished in particular by using a silicon gate electrode as the diffusing mask defining both the source and drain regions which silicon gate electrode is diffused with the same impurities and to the same concentration as the source and drain regions.

SUMMARY OF THE INVENTION

It is an object of the invention to provide a semiconductor device containing an improved charge-coupled array.

It is another object of the invention to provide a charge-coupled array which uses a semiconductor body having different doping levels therein aligned to the phase electrodes.

It is a further object of the invention to provide a semiconductor charge-coupled array in conjunction with a self-aligned Field Effect Transistor having increased threshold voltage stability.

It is still a further object of the invention to produce an improved self-aligned Field Effect Transistor and an improved charge-coupled array in which surface inversion problems are reduced or eliminated.

It is a further object of the invention to provide a high density charge-coupled array which has, during operation, substantially zero spacing between created depletion regions, thus improving the efficiency of the array.

It is still another object of the present invention to describe a process for producing this improved semiconductor device. The process so described is not only simple, but results in a superior product.

More particularly, the present invention teaches that a self-aligned Field Effect Transistor and a charge-coupled array can be provided in a single semiconductor body. This is accomplished by utilizing a series of steps to provide in the body regions of different concentrations of dopants such that the charge stored in the charge-coupled array depletion region is considerably higher than that stored by arrays known to the prior art. These diffused regions are created in the semiconductor body under a plurality of conductive electrodes which overlie an insulating layer on the body.

In greater detail, the process for producing the present invention comprises the growing of a thin insulating layer, such as silicon dioxide, on the surface of a semiconductor body. Over this first layer there is deposited a relatively thick layer of a semiconductor such as, polysilicon. This layer should desirably have the same conductivity as that of the underlying silicon body. This semiconductor layer is, in turn, coated with a deposit of silicon nitride. The silicon nitride layer serves as a mask for selectively etching the polysilicon and also as a diffusion mask. A first diffusion or ion implantation is then made into the region between the FET and the charge-coupled array to prevent surface inversion problems and to provide good isolation between the FET and the charge-coupled array. This region can be a field region, that is, it can be made to surround the FET and the charge-coupled array. A second diffusion is then made to create the FET drain and source regions followed by a third diffusion into portions of the charge-coupled array to increase its efficiency and its capacity for storing charge.

DESCRIPTION OF THE DRAWINGS

The present invention can be best understood by study of the following specification in conjunction with the drawings.

DESCRIPTION OF THE PREFERRED EMBODIMENT

Figure 1:
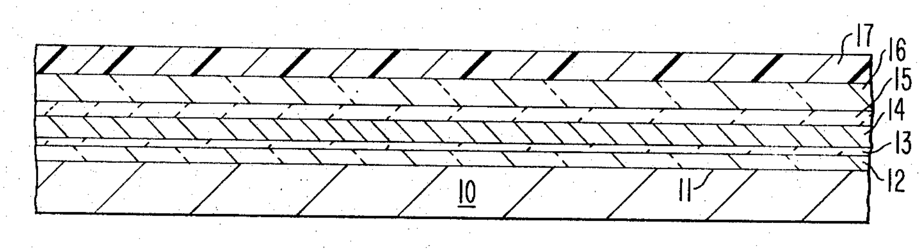
FIGS. 1 to 6 illustrate the unit in various stages of manufacture.

Referring now to the drawings, a semiconductor device composed of a self-aligned FET and charge-coupled device will be described in detail as to its fabrication and operation. The operation of FET devices and/or charge-coupled devices is now known and taught in the prior art.

Illustrated in FIGS. 1 through 6 is a monocrystalline body of semiconductor material 10 such as P type silicon preferably having a resistivity of about 10 ohm-centimeters. This resistivity indicates that the material 10 has an impurity concentration of about $10^{15}$ impurity atoms per cubic centimeter. To produce the desired charge-coupled array the resistivity of the starting material should be as high as possible. However because it is desirable to build an FET in the same body 10 the resistivity must be lowered because of the requirements of the FET characteristics. Desirably for FET devices the resistivity should be 10 ohm-centimeters or less.

Although for the purposes of describing this invention, reference will be made to P type semiconductor material, it should be understood that the opposite type conductivity material may also be utilized.

Following cleaning of the uppermost surface 11 of the body 10, a layer 12 of silicon dioxide 600 Angstroms thick is formed thereon. This layer 12 can be produced by a chemical vapor deposition process by heating the semi-conductor body to 1,100°C and 1,200°C, in a hydrogen atmosphere containing a small amount of oxygen for about twenty minutes.

Following the establishment of the silicon dioxide layer 12, a silicon nitride layer 13, having a thickness of 150 Angstroms, may be formed over layer 12. One particular method of forming such silicon nitride coatings, (known to the semiconductor art), comprises a treatment in which silane (SiH1) and ammonia (NH3) are mixed, in a carrier gas stream of hydrogen, and introduced into a chamber containing the silicon body at a temperature of about 900°C. At this temperature a reaction occurs, involving a decomposition of the silane, which results in the formation of the layer 13 deposited on the silicon dioxide layer 12. This layer need not be thicker than 150 A.

Subsequent to the creation of the silicon nitride layer 13, a polysilicon layer 14, about 2,000 Angstroms thick, containing approximately $10^{16}$ p type impurities per cubic centimeter, is grown on the surface of layer 13. This polysilicon layer is formed by the known technique of epitaxial growth caused by placing the unit 10 in a chamber heated to about 900°C in the presence of a decomposed silane gas contained in a hydrogen stream. When an epitaxial layer is thus grown on an oxide or nitride layer, the layer so grown will be polycrystalline. If desired, the layer can be grown in the presence of a suitable dopant gas or it can be subsequently doped. If subsequently doped, the underlying silicon nitride layer 13 will act as a diffusion mask preventing the dopant from penetrating into the oxide layer 12. Over this polysilicon layer 14 there is now deposited a second layer of silicon nitride 15. This nitride layer 15 is 600 Angstroms thick and is grown using the technique described above. Over this second nitride layer 15, a 3,000 Angstrom thick layer of silicon dioxide 16 is formed to assure a base for the adhesion of any subsequent photoresist layers which do not adhere well to silicon nitride. Preferably, this latter layer of silicon dioxide is formed by pyrolytic deposition at about 800°C.

Figure 2:
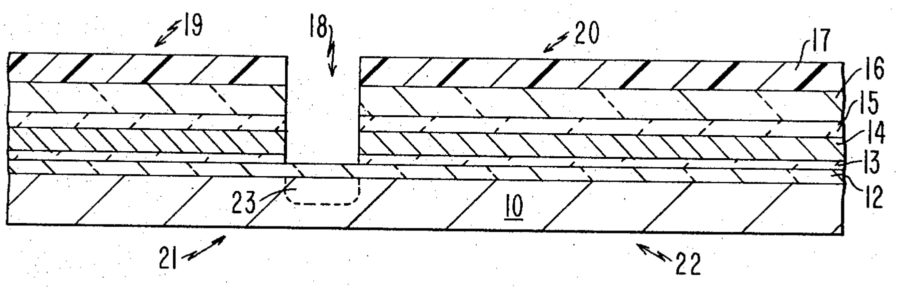

Once all these various layers of selected materials have been deposited on the surface of the semiconductor body 10, in the required thickness, a photoresist mask 17 is provided over the entire surface and exposed, in accordance with well known techniques, to permit the opening of a window 18, in the layers 13 through 17 to thereby define two distinct islands 19 and 20 in the layers 13 to 16 as shown in FIG. 2. The initial oxide layer 12 is not etched. Under Island 19 a self-aligned FET device will be produced and under island 20 a charge-coupled device channel will be created.

These islands 19 and 20 are formed by removing, in the region of window 18, the layers 13 through 16 of the various materials. This is accomplished by using different etchants for each of the different materials. For example, the outermost silicon dioxide layer 16 is removed by dipping the photoresist coated unit in a solution of a buffered hydroflouric acid so as to remove the unmasked portions of layer 16 underlying the window 18. However, since the hydroflouric acid solution does not substantially attack silicon nitride, layer 15 would be unaffected, thus the etching treatment using the hydrochloric solution terminates upon reaching layer 15. Layer 15 is, in turn, removed by using a hot phosphoric acid which attacks only that portion of layer 15 which has been exposed by removal of layer 16 under window 18. Simultaneously, this hot phosphoric solution will also attack and dissolve the photoresist layer 17. However, since the photoresist layer 17 is no longer effective as an etchant mask, it does not matter whether layer 17 remains on the surface of the silicon oxide layer 16 or not. The silicon oxide layer 16 itself is now the primary barrier to the etchant action of the phosphoric solution; that is, the hot phosphoric solution can attack silicon nitride only in the region exposed by the previously opened window 18 in the layer 16.

Layer 14 is also removed by subjecting the body to a buffered hydroflouric solution. Since the photoresist layer has now been removed by the hot phosphoric solution used to open the window in layer 15, the layer 16 is exposed to the solution used to etch layer 14 and is also etched. However, because layer 16 is made substantially thicker than any of the other layers, it is not etched away, but only reduced in thickness. Once the appropriate opening is etched in layer 14, the unit is again subjected to a hot phosphoric solution to etch the required opening in layer 13. In this manner, the window 18 is extended towards the surface 11 through layers 13 to 16.

At this time gallium or other acceptor impurities are diffused or ion-implanted into the semiconductor body through window 18 to form an isolation diffusion 23 in the body. This diffusion 23 assures that surface inversion problems will be avoided and provides electrical isolation between the region 21 underlying island 19, in which the FET is to be formed, and region 22, underlying island 20, in which the charge-coupled channel is to be formed. This diffusion 23 can be made in the form of a ring surrounding the island 19 and a ring surrounding the island 20. Thus this diffusion can be a portion of a field region protecting both the FET and the charge-coupled array from unwanted surface states.

The gallium so diffused in the body is prevented from diffusing anywhere else in the semiconductor body 10 except under window 18 by the layers overlying the surface of the device. The initial layer 12 of silicon dioxide formed on the surface of the semiconductor body being relatively thin will not act as a bar to such gallium diffusion. Although it is preferred that layer 12 remain on the surface 11 and the gallium diffusion occur through it, it can be removed if such is desired. Under some circumstances, this entire isolation diffusion step may be eliminated if so desired.

Figure 3:
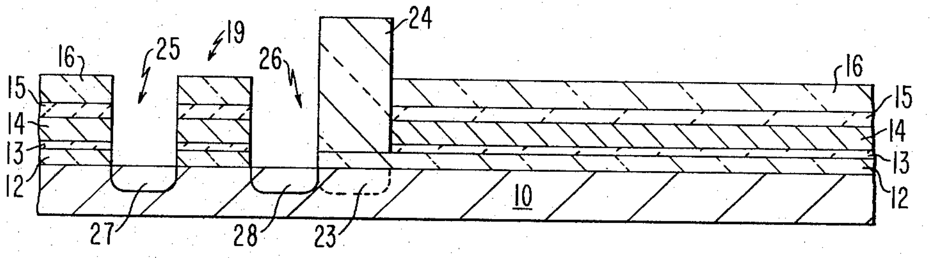

After the creation of isolation diffusion 23, the coated body 10 is heated to about 1,050°C and exposed to an oxidizing atmosphere of steam so that a thermal oxide plug 24, as shown in FIG. 3, will grow in the previously etched window 18. This oxide plug 24 grows only in the exposed window 18 and does not grow elsewhere because of the barrier action of the layers coating the body 11. Preferably, this layer is made relatively thick; that is, in the order of 8000 Angstroms or more.

Figure 4:
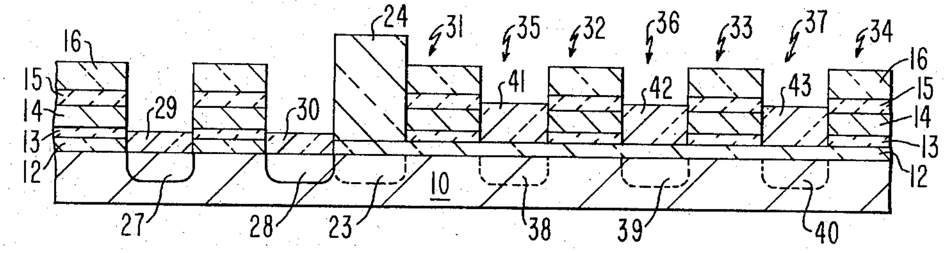

A second photoresist and etching operation is now formed in island 19 to etch the various layers 12 through 16 to define a source window 25 and a drain window 26 in order to create an FET by using the known self-aligned gate process in which the polysilicon layer 14 acts as the gate conductor and exists on the device prior to the creation of the source and drain. The layers 12 through 16 are removed as described above. Source and drain N+ diffusions 27 and 28 are now formed by a standard diffusion technique followed by the usual drive-in diffusion step. For the described semiconductor body 10 arsenic is preferably used as the diffusant to create the source and drain regions 27 and 28. With arsenic the diffusion time is 900°C. If desired these source and drain regions 27 and 28 could be formed by ion implantation. Following the formation of the source and drain regions 27 and 28, the exposed surface of the semiconductor material over the now defined source and drain regions 27 and 28 is reoxidized by the above described thermal oxidation step to form oxide plugs 29 and 30 in the windows 25 and 26 as shown in FIG. 4. These source and drain plugs are formed at this time to assure protection of the defined source and drain regions 27 and 28 during subsequent processing and formation of the charge-coupled channel under the island 20. When the regions 27 and 28 are diffused this step is used to "drive-in" the diffusion 27 and 28. When ion implanted this step also serves to anneal the implanted regions.

To form the charge-coupled channel the entire semiconductor body 10 is again masked with a photoresist and the island 20 is etched using the above described procedures into a series of in line separate smaller segments 31, 32, 33 and 34 separated by openings 35, 36 and 37 as shown in FIG. 4. Once again, the initial layer 12 is not removed. After the layers 13 to 16 are etched off, gallium or an other P type dopant is diffused or ion-implanted into the body 10 under the opening 35, 36 and 37 to produce P+ regions 38, 39 and 40. Preferably, with the described starting material these regions 38, 39 and 40 should be made to have a concentration of P type impurities of between $10^{17}$ and $10^{18}$ impurity atoms per cubic centimeter. The oxide layer 12 is so thin that it does not appreciably interfere with either the diffusion or ion-implantation of these impurities and the semiconductor material exposed to the dopant, i.e., regions 38, 39 and 40 will be doped to a concentration higher than the concentration in the remainder of the body. The portion of the body under the oxide plugs 24, 29 and 30 and under the remaining silicon nitride and polysilicon layers 12 to 16 is protected and no impurities are introduced therein.

Following this diffusion of gallium, the body is again subjected to the thermal oxidation process and plugs of silicon oxide 41, 42 and 43 each having a thickness of approximately 3,000 Angstroms are formed in the openings 35, 36, and 37.

Figure 5:
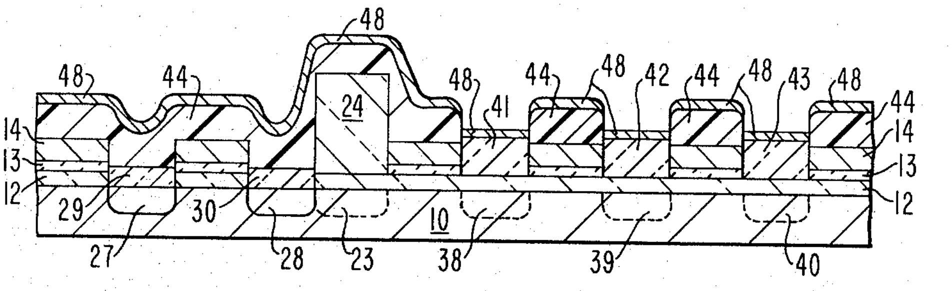

Following the growth of these oxide plugs 41, 42 and 43, the remaining portions of silicon dioxide layer 16 and silicon nitride layer 15 are removed as shown in FIG. 5.

Following the final removal of all the silicon dioxide layer 16 and the silicon nitride layer 15, a photoresist layer 44 of approximately 12,000 Angstroms in thickness is placed over the surface of the wafer using conventional techniques and windows opened in it over the oxide plugs 41, 42 and 43. Once these windows are so opened in the photoresist layer 44, a thin layer of chromium approximately 400 Angstroms to 500 Angstroms in thickness is deposited over the entire wafer surface as shown in FIG. 5. Preferably, this deposition of chromium is performed by a room temperature sputtering operation. A typical procedure for producing such a film is as follows: The entire unit is placed in a conventional supttering system either dc or RF and the surface of the unit is coated with a film of the selected conductive material. Because the sputtered material is directed toward the top surface of the entire device, little or no sputtered material will adhere to the sides of the windows opened in the photoresist layer 44. Thus only the surface of the photoresist layer and the top surfaces of the plugs will be coated.

Generally, any solid conductive material is suitable for use as the conductive film 48. Typical materials could be, for example, chromium or molybdenum. In any event the sputtered film should have a thickness between 300 and 500 Angstroms to achieve conductivity in the thin film. Once an acceptable thickness of film 48 has been formed, the coated unit is removed from the sputtering chamber and the photoresist layer 44 is stripped from the surface. The removal of the photoresist will also remove the film 48 deposited over it. It will however not affect the film 48 deposited over the oxide plugs 40, 41 and 42.

Figure 6:
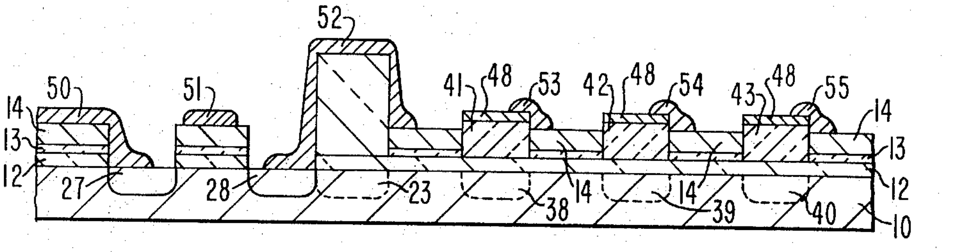

The unit is again masked and as shown in FIG. 6 contact holes to the source and drain are etched in accordance with the usual techniques well known to the semiconductor art. Following the etching of the source and drain contact holes, a series of conductive electrode strips 50, 51, 52, 53, 54 and 55 are laid down over the described unit. The electrodes 50, 51 and 52 contact the source, gate and drain, respectively, of the FET created in island 19. Electrode 52 also serves to couple the FET to the charge-coupled array. Electrodes 53, 54 and 55, together with electrode 52, act as electrodes to the charge-channel array created under island 19. Each of the strips 53, 54 and 55 joins together a single polycrystalline layer 14 and a single adjacent thin metallic film 48. Because the film 48 exists over the top of the oxide plugs 40, 41 and 42, the electrodes, 53, 54 and 55 can be made very narrow and need only to make contact between the polycrystalline island and the adjacent film. Preferably, these strips are formed of a conductive material different from that of the film 48. Such electrode strips may be deposited by placing the unit in a conventional evaporator and a coating of a conductive material, such as aluminum laid down over the entire surface using normal evaporation techniques. The unit is then removed from the evaporator masked and the excess aluminum etched away. In this etching step it is necessary that an etchant be used that will attack the exposed aluminum but not attack the other materials. Such an etchant can be, for example, a solution consisting of phosphoric acid, nitric acid and water. The unit as described and shown in FIG. 6 thus depicts an FET and a charge-channel array interconnected one with another through the medium of electrode 52.

The operation of FET devices is well known to the semiconductor art as is also the utilization of such charge-channel array and especially when they are used as shift registers. The described device, however, has in the charge-channel array a greater charge density carrying capacity because of the addition of diffusions 38, 39 and 40 underlying the charge-channel array. Because these diffusions exist in the device and have a higher concentration than the original concentration in body 10, the charge density Q that can be stored and transferred in the described charge-coupled array is roughly improved by a factor of $(Nm/Nt)^{1/2}$ where Nm is concentration of the diffused regions and Nt is the concentration found in body 10. This is more clearly pointed out by the following equation:

$$\frac{Q}{QD} = \frac{Tm}{Tt} (Nm/Nt)^{1/2} - 1$$

where QD is the charge concentration originally existing in the body, and where T*m* and T*t* are respectively the thicknesses of the insulating layers 12 and 13 under the polycrystalline material 14 and the combined thickness of the plugs 41, 42, and 43 and the layer 12 underlying the film 48.

Under some conditions and especially when ion-implantation is used to create the described structure the silicon nitride layer 13 need not be used since this layer 13 is used only to assure that the region underlying the gate of the FET is not adversely affected by unwanted impurity diffusing through the gate oxide. This elimination of layer 13 not only simplifies the process but also eliminates the sandwich structure in the gate region which is known in the prior art to cause threshold voltage stability problems. Thus this modified process thus maintains the advantages of the self-aligned gate process while avoiding its disadvantages. The device as described further eliminates surface inversion and eliminates the probability of electrical discontinuities in the charge-coupled array, while simultaneously improving the charge density that can be carried in the charge-coupled channel.

It should be understood that although the invention is described using aluminum for the electrode strips and chromium as the film on the surface of the plugs, these materials could be interchanged or other suitable conductive materials used in their place.

While the invention has been particularly shown and described with reference to the preferred embodiment thereof, it will be understood by those skilled in the art that various changes in form and details of the apparatus and the method in process to produce the apparatus may be made therein without departing from the spirit and scope of the invention and that the method is in no way restricted by the apparatus.

What is claimed is:

1. A method of making a semiconductor device having diffused regions in a semiconductor body which comprises selecting a semiconductor body of uniform conductivity type 1. forming an insulating layer on the body
2. forming a silicon layer on said insulating layer
3. forming a silicon nitride layer over the silicon layer
4. etching away portions of the silicon nitride layer
5. etching away the portions of the silicon layer exposed through the silicon nitride layer,
6. diffusing impurities of a conductivity type opposite to that of the body through the etched away portions of the silicon nitride and silicon layer into the insulating layer and underlying semiconductor body
7. said silicon nitride acting as a diffusion mask to prevent the diffused impurities from diffusing into the silicon layer
8. removing the silicon nitride layer
9. making contact to the diffused regions and to the silicon layer.

2. A method of forming a charge coupled device having an increased capacity for storing charge therein which comprises the steps of, growing a layer of a first insulating material on the surface of a semiconductor body of a selected conductivity type and impurity concentration, depositing a layer of semiconductor material on said insulating layer, coating said layer of semiconductor material with a layer of dielectric material having an etchant characteristic different from said layer of semiconductor material, forming a patterned mask on said layer of dielectric material providing a series of windows over said dielectric material, removing the dielectric material and the semiconductive material under each of said windows by sequentially etching said layers, diffusing impurities of the same conductivity type as said body into said body under each of said windows, removing the remaining portions of said layer of dielectric material, growing a second layer of insulating material, of the same type as said first insulating material, in each of said windows, coating said second layer in each window with a conductive material, and forming electrical connections between a coating on one of said second layers and an adjacent semiconductive layer.

3. The method of claim 2 wherein said patterned mask is configured with windows that provide an isolated region in said layer of semiconductive material adjacent each window.

4. The method of claim 3 wherein said coating on each second layer in each window is electrically connected to an adjacent isolated region of semiconductive material.

5. The method of claim 4 wherein said first insulating layer is silicon dioxide, said layer of semiconductive material is polycrystalline silicon, said dielectric material is silicon nitride and said second insulative material is silicon dioxide.

6. The method of claim 5 wherein there is further provided the step of depositing a dielectric material on the surface of said layer of first insulating layer and before said layer of semiconductive material is deposited and the step of etching the dielectric material below the layer of semiconductor material before diffusing impurities into said body.

7. The method of claim 6 wherein said layer of semiconductor material is rendered conductive while it is being deposited.

8. A method of forming in a semiconductor body of uniform conductivity type a charge coupled device which comprises 1. growing a first, thin, 600 Angstrom thick, layer of silicon dioxide on the surface of the body by heating the body in the presence of oxygen,
2. depositing a 150 Angstrom thick diffusion formed layer of silicon nitride on the silicon dioxide layer by heating the body to 900°C in the gas stream of hydrogen containing silane and ammonia,
3. epitaxially growing a 2,000 Angstrom thick layer of polycrystalline silicon containing $10^{16}$ impurities of the same conductivity type as said body on the silicon nitride layer by heating the body to 900°C in the presence of a decomposed silane gas contained in a hydrogen stream,
4. depositing a second layer of silicon nitride 600 Angstroms in thickness, on the polycrystalline silicon layer,
5. pyrolytically depositing a second 3,000 Angstroms thick layer of silicon dioxide on the second layer of silicon nitride,
6. placing a layer of photoresist on said layer of silicon dioxide,
7. defining a series of windows in said photoresist layer to selectively expose portions of said second layer of silicon dioxide,
8. removing said second layer of silicon dioxide and said first and second layers of silicon nitride and the polysilicon layer to form openings in said layers under each of the windows in said photo mask by sequentially etching said layers and to form spaced apart islands of polysilicon,
9. diffusing impurities of the same conductivity type as said body into the portions of the body underlying each of the openings to form regions in said body housing a concentration of impurities of between $10^{17}$ and $10^{18}$ impurity atoms per cubic centimeter,
10. growing 3,000 Angstrom thick plugs of silicon dioxide in said openings,
11. removing the remaining portions of said second layer of silicon dioxide and said second layer of silicon nitride to expose the islands of polycrystalline silicon,
12. masking the exposed polycrystalline silicon islands,
13. depositing a layer of conductive material 300 to 500 Angstroms in thickness on said plugs by an RF sputtering technique,
14. removing the mask on the polycrystalline silicon, and
15. forming a series of electrodes over said conductive material and said polycrystalline silicon islands each electrode of the series electrically, connecting together a layer of conductive material on one of said plugs and one of said islands.

* * * * *